(12) United States Patent
Hong et al.

(10) Patent No.: US 10,410,916 B2
(45) Date of Patent: Sep. 10, 2019

(54) SEMICONDUCTOR DEVICE

(71) Applicant: Samsung ELectronics Co., Ltd., Suwon-si, Gyeonggi-do (KR)

(72) Inventors: Jiseok Hong, Yongin-si (KR); Kiseok Lee, Hwaseong-si (KR); Jemin Park, Suwon-si (KR); Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/106,266

(22) Filed: Aug. 21, 2018

(65) Prior Publication Data

US 2019/0221475 A1 Jul. 18, 2019

(30) Foreign Application Priority Data

Jan. 17, 2018 (KR) ........................ 10-2018-0006165

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 21/768* | (2006.01) | |
| *H01L 23/532* | (2006.01) | |
| *H01L 23/522* | (2006.01) | |

(52) U.S. Cl.
CPC .... *H01L 21/76831* (2013.01); *H01L 21/7682* (2013.01); *H01L 21/76835* (2013.01); *H01L 23/53238* (2013.01); *H01L 23/53295* (2013.01); *H01L 23/5222* (2013.01)

(58) Field of Classification Search
CPC ............. H01L 21/764; H01L 21/76897; H01L 2221/1031; H01L 21/7682; H01L 21/76802; H01L 23/5226; H01L 21/76831
USPC .................................................. 257/750, 758
See application file for complete search history.

(56) References Cited

U.S. PATENT DOCUMENTS

| | | | |
|---|---|---|---|
| 7,094,669 B2 * | 8/2006 | Bu ..................... | H01L 21/76807 257/E21.581 |
| 7,560,375 B2 | 7/2009 | Filippi et al. | |
| 7,754,601 B2 | 7/2010 | Chen et al. | |
| 7,868,455 B2 | 1/2011 | Chen | |
| 7,994,046 B2 | 8/2011 | Jeng | |
| 8,298,911 B2 | 10/2012 | Lee | |
| 8,436,473 B2 | 5/2013 | Chen et al. | |
| 8,629,560 B2 | 1/2014 | Liu et al. | |
| 8,847,401 B2 | 9/2014 | Chen et al. | |
| 9,214,381 B2 | 12/2015 | Lee et al. | |
| 9,768,118 B1 | 9/2017 | Li et al. | |
| 2002/0158337 A1 * | 10/2002 | Babich ................ | H01L 21/7681 257/758 |
| 2009/0081862 A1 | 3/2009 | Chen et al. | |
| 2010/0001409 A1 | 1/2010 | Humbert et al. | |

(Continued)

*Primary Examiner* — S. V. Clark
(74) *Attorney, Agent, or Firm* — Myers Bigel, P.A.

(57) ABSTRACT

A semiconductor device includes an interlayer insulation layer on a semiconductor substrate, a via plug and a wiring line on the via plug, in the interlayer insulation layer, the via plug and the wiring line coupled with each other and forming a stepped structure. The semiconductor device includes a first air-gap region between the interlayer insulation layer and the via plug, and a second air-gap region between the interlayer insulation layer and the wiring line. The first air-gap region and the second air-gap region are not vertically overlapped with each other.

20 Claims, 21 Drawing Sheets

(56) References Cited

U.S. PATENT DOCUMENTS

| | | | |
|---|---|---|---|
| 2011/0210449 A1* | 9/2011 | Nitta | H01L 21/76808 257/774 |
| 2012/0112361 A1* | 5/2012 | Han | H01L 23/481 257/774 |
| 2018/0261590 A1* | 9/2018 | Ryu | G06F 17/5072 |
| 2018/0358260 A1* | 12/2018 | Roy | H01L 21/7682 |

* cited by examiner

SEMICONDUCTOR DEVICE

CROSS-REFERENCE TO RELATED APPLICATION

This non-provisional application claims priority under 35 U.S.C. § 119 to Korean Patent Application No. 10-2018-0006165, filed on Jan. 17, 2018, in the Korean Intellectual Property Office, the disclosure of which is hereby incorporated in its entirety by reference.

BACKGROUND

Example embodiments of the present disclosure relate to a semiconductor device. High integration, high density, low power consumption, and high speed operation semiconductor devices are designed using multi-level wiring structure. To enable the high speed operation of the semiconductor devices, copper is used as a material for forming a wiring line because of the low resistivity and low cost. A copper wiring line is formed by a damascene process due to the difficulty in etching copper.

A distance between the wiring lines may be reduced by the high integration of the semiconductor devices. Thus, the interference between the wiring lines may be increased due to the narrow distance therebetween, such that a signal transmitting speed may be lower as the distance between wiring lines is reduced.

SUMMARY

According to example embodiments of the inventive concepts, a semiconductor device may include an interlayer insulation layer on a substrate, a via plug in the interlayer insulation layer, the via plug having opposite first and second via sidewalls, a first wiring line in the interlayer insulation layer, the first wiring line coupled with via plug and having a first wiring sidewall adjacent to the first via sidewall and a second wiring sidewall opposite to the first wiring sidewall and adjacent to the second via sidewall, a first via insulation liner covering the first via sidewall, a first wiring insulation liner covering the first wiring sidewall, a first via air-gap region between the first via insulation liner and the interlayer insulation layer, the first via air-gap region exposing the first via insulation liner to the interlayer insulation layer, and a first wiring air-gap region between the first wiring insulation liner and the interlayer insulation layer, the first wiring air-gap region exposing the first wiring insulation liner to the interlayer insulation layer. The first via sidewall and the second wiring sidewall may be misaligned with each other.

According to example embodiments of the inventive concepts, a semiconductor device may include an interlayer insulation layer on a semiconductor substrate, a via plug and a wiring line on the via plug, in the interlayer insulation layer, the via plug and the wiring line coupled with each other and forming a stepped structure, a first insulation layer covering a sidewall of the via plug and a sidewall of the wiring line, a second insulation layer covering a sidewall of a portion of the first insulation layer covering the sidewall of the via plug, the second insulation layer including a different material from the first insulation layer, an air-gap region between the interlayer insulation layer and the wiring line, the air-gap region exposing the first insulation layer to the interlayer insulation layer, and a damaged region in a portion of the interlayer insulation layer adjacent to the air-gap region and the second insulation layer. A carbon concentration in the damaged region may be lower than a carbon concentration in the interlayer insulation layer and be higher than a carbon concentration in the second insulation layer.

According to example embodiments of the inventive concepts, a semiconductor device may include an interlayer insulation layer on a semiconductor substrate, a via plug and a wiring line on the via plug, in the interlayer insulation layer, the via plug and the wiring line coupled with each other and forming a stepped structure, a first air-gap region between the interlayer insulation layer and the via plug, and a second air-gap region between the interlayer insulation layer and the wiring line. The first air-gap region and the second air-gap region may be not vertically overlapped with each other.

DETAILED DESCRIPTION

Figure 1:
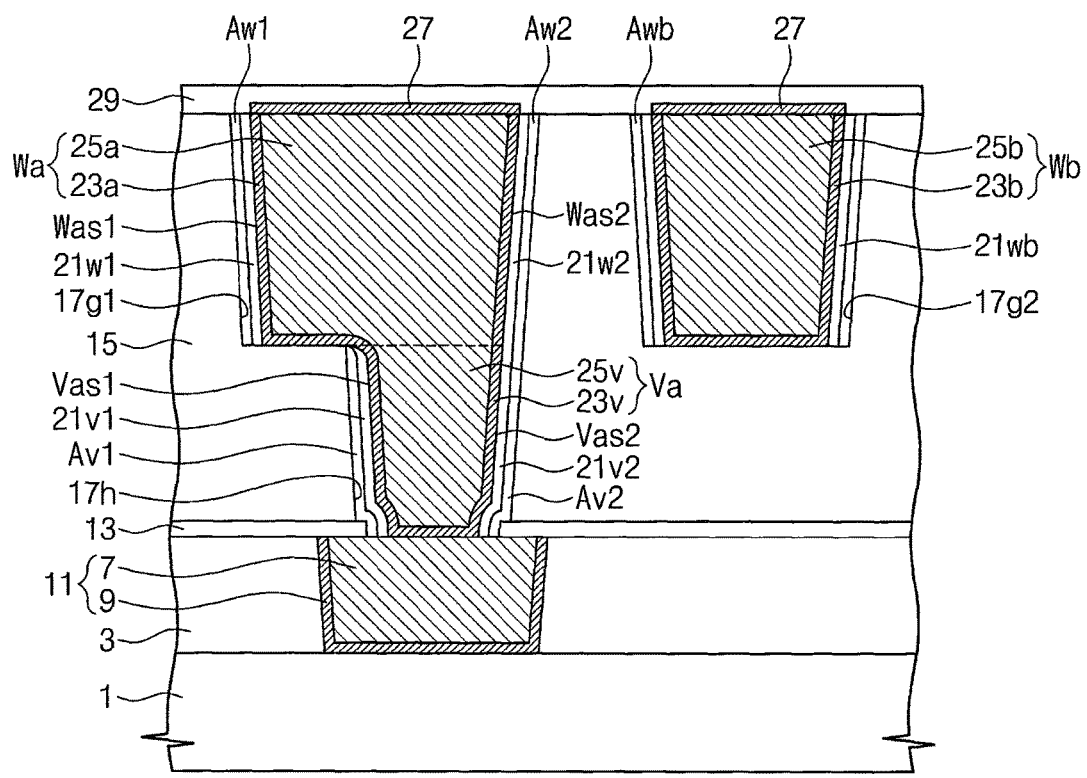
FIG. 1 is a cross-sectional view of a semiconductor device according to example embodiments.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Various example embodiments will now be described more fully hereinafter with reference to the accompanying drawings. Like reference numerals may refer to like elements throughout this application.

Figure 2:
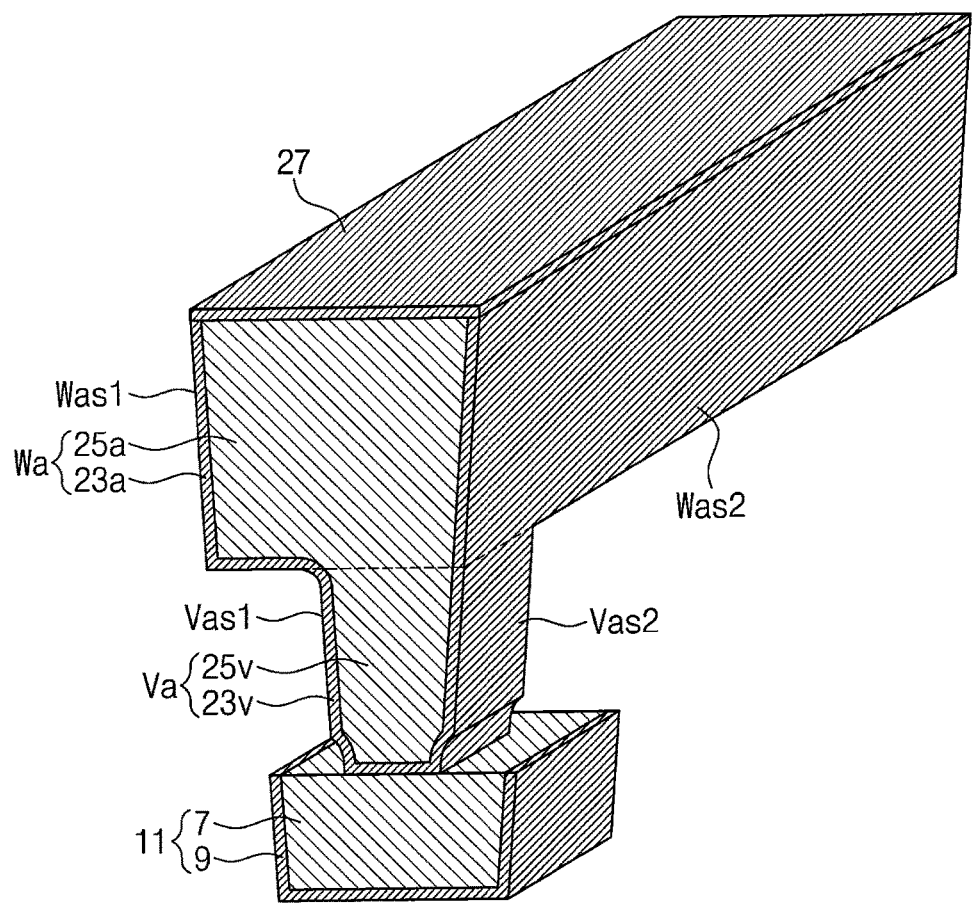
FIG. 2 is a perspective view of a portion of a semiconductor device according to example embodiments.

FIG. 1 is a cross-sectional view of a semiconductor device according to example embodiments. FIG. 2 is a perspective view of a portion of a semiconductor device according to Referring to FIGS. 1 and 2, a semiconductor substrate 1 is provided. The semiconductor substrate 1 may include a semiconductor material, for example, silicon or germanium, of a crystalline structure. The semiconductor substrate 1 may be, for example, a mono-crystalline silicon wafer or a silicon on insulator (SOI) substrate. A lower conductive pattern 11 is disposed on the semiconductor substrate 1. The lower conductive pattern 11 includes a lower conductive part 7 and a lower diffusion prevention pattern 9 contacting a sidewall and a lower surface of the lower conductive part 7. The lower conductive part 7 may include, for example, copper, aluminum, or tungsten. The lower diffusion prevention pattern 9 may include, for example, titanium nitride or tantalum nitride. The lower conductive pattern 11 may be electrically connected to, for example, an impurity doped region in the semiconductor substrate 1. A sidewall of the lower conductive pattern 11 is covered by a lower interlayer insulation layer 3. The lower interlayer insulation layer 3 may cover the semiconductor substrate 1. The lower interlayer insulation layer 3 may include a porous low-k dielectric material, for example, SiOCH. An upper surface of the lower interlayer insulation layer 3 may be coplanar with an upper surface of the lower conductive pattern 11.

A lower etch stop layer 13 and an upper interlayer insulation layer 15 are sequentially stacked on the lower conductive pattern 11. The lower etch stop layer 13 may include, for example, silicon nitride. The upper interlayer insulation layer 15 may include a porous low-k dielectric material, for example, SiOCH.

A via hole 17h and a first groove 17g1 that are overlapped with each other are disposed in the upper interlayer insulation layer 15. The via hole 17h and the first groove 17g1 may form a dual damascene hole structure. The via hole 17h may penetrate the upper interlayer insulation layer 15 and the lower etch stop layer 13 to expose the lower conductive pattern 11. A width of an upper portion of the via hole 17h may be greater than a width of a lower portion of the via hole 17h. The via hole 17h may partly expose an upper surface of the lower etch stop layer 13. The via hole 17h may be exposed at a bottom of the first groove 17g1. The first groove 17g1 may be adjacent to, connected to, or communicate with the via hole 17h. A width of the first groove 17g1 may be greater than the width of the via hole 17h. An inner sidewall of the first groove 17g1 may laterally protrude further than an inner sidewall of the via hole 17h adjacent thereto. Another sidewall of the first groove 17g1 may be aligned with (or continuously connected to) another sidewall of the via hole 17h adjacent thereto. A second groove 17g2 that is spaced apart from the first groove 17g1 is disposed in the upper interlayer insulation layer 15. A lower surface of the second groove 17g2 may be positioned at the same height as the bottom of the first groove 17g1 with respect to an upper surface of the semiconductor substrate 1. The first groove 17g1 and the second groove 17g2 may have a linear shape extending in a direction. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts.

A via plug Va is disposed in the via hole 17h. A first wiring line Wa is disposed in the first groove 17g1. A second wiring line Wb is disposed in the second groove 17g2. The via plug Va and the first wiring line Wa may be integrally coupled with each other. The second wiring line Wb may be connected to a via plug. The via plug Va includes a via conductive part 25v and a via diffusion prevention pattern 23v covering a sidewall and a lower surface of the via conductive part 25v. The first wiring line Wa includes a first wiring conductive part 25a and a first wiring diffusion prevention pattern 23a contacting a sidewall and a lower surface of the first wiring conductive part 25a. The via conductive part 25v and the first wiring conductive part 25a may be integrally coupled with each other. The via conductive part 25v and the first wiring conductive part 25a may include a same material, for example, copper. The via diffusion prevention pattern 23v and the first wiring diffusion prevention pattern 23a may be integrally coupled with each other. The via diffusion prevention pattern 23v and the first wiring diffusion prevention pattern 23a may include a same material, for example, titanium nitride or tantalum nitride.

The via plug Va has opposite first and second via sidewalls Vas1 and Vas2. The first wiring line Wa has a first wiring sidewall Was1 adjacent to the first via sidewall Vas1 and a second wiring sidewall Was2 opposite to the first wiring sidewall Was1. The first wiring sidewall Was1 may not be vertically overlapped or aligned with the first via sidewall Vas1. The first wiring sidewall Was1 may be laterally protruded compared to the first via sidewall Vas1. For example, the first wiring line Wa and the first via plug Va that are integrally coupled with each other may have the first wiring sidewall Was and the first via sidewall Vas1 that are misaligned with each other, or be configured to have a stepped structure. The second wiring sidewall Was2 may be continuously connected to or aligned with the second via sidewall Vas2, such that the second wiring sidewall Was2 and the second via sidewall Vas2 may extend in a line.

The first via sidewall Vas1 contacts (or is covered by) a first via insulation liner 21v1. The second via sidewall Vas2 contacts (or is covered by) a second via insulation liner 21v2. The first wiring sidewall Was1 contacts (or is covered by) a first wiring insulation liner 21w1. The second wiring sidewall Was2 contacts (or is covered by) a second wiring insulation liner 21w2. The first via insulation liner 21v1, the second via insulation liner 21v2, the first wiring insulation liner 21w1, and the second wiring insulation liner 21w2 may include a same material, for example, silicon nitride, silicon carbonitride, and/or aluminum nitride. The second wiring insulation liner 21w2 and the second via insulation liner 21v2 may be integrally coupled with each other. A width of an upper end portion of the first via insulation liner 21v1 may be smaller than a width of a middle portion of the first via insulation liner 21v1. The width of the end portion of the first via insulation liner 21v1 may be narrowed in a direction far away from the semiconductor substrate 1. The upper end portion of the first via insulation liner 21v1 contacting the lower surface of the first wiring line Wa may be rounded. As used herein, the term "and/or" includes any and all combinations of one or more of the associated listed items. Expressions such as "at least one of," when preceding a list of elements, modify the entire list of elements and do not modify the individual elements of the list.

A first via air-gap region Av1 is disposed between the first via insulation liner 21v1 and a portion of the upper interlayer insulation layer 15 adjacent thereto. The first via air-gap region Av1 may expose the first via insulation liner 21v1. A second via air-gap region Av2 is disposed between the second via insulation liner 21v2 and a portion of the upper interlayer insulation layer 15 adjacent thereto. The second via air-gap region Av2 may expose the second via insulation liner 21v2. The first and second via air-gap regions Av1 and Av2 may expose a portion of an upper surface and a sidewall of the lower etch stop layer 13.

A first wiring air-gap region Aw1 is disposed between the first wiring insulation liner 21w1 and a portion of the upper interlayer insulation layer 15 adjacent thereto. The first wiring air-gap region Aw1 may expose the first wiring insulation liner 21w1. A second wiring air-gap region Aw2 is disposed between the second wiring insulation liner 21w2 and a portion of the upper interlayer insulation layer 15 adjacent thereto. The second wiring air-gap region Aw2 may expose the second wiring insulation liner 21w2.

The second via air-gap region Av2 and the second wiring air-gap region Aw2 may be adjacent to, connected to, or communicate with each other and extend in a line. In some embodiments the first via air-gap region Av1 may not be adjacent with the first wiring air-gap region Aw1 and may be separated from the first wiring air-gap region Aw1. A lower surface of the first wiring line Wa may contact the upper interlayer insulation layer 15, between the first via air-gap region Av1 and the first wiring air-gap region Aw1.

The second wiring line Wb includes a second wiring conductive part 25b and a second wiring diffusion prevention pattern 23b covering a sidewall and/or a lower surface of the second wiring conductive part 25b. The second wiring conductive part 25b may include, for example, copper. The second wiring diffusion prevention pattern 23b may include, for example, titanium nitride or tantalum nitride. A sidewall of the second wiring line Wb may be covered by a third wiring insulation liner 21wb. The third wiring insulation liner 21wb may include, for example, silicon nitride, silicon carbonitride, and/or aluminum nitride. A third wiring air-gap region Awb is disposed between the third wiring insulation liner 21wb and a portion of the upper interlayer insulation layer 15 adjacent thereto. The third wiring air-gap region Awb may expose the third wiring insulation liner 21wb.

A protection layer 27 covers upper surfaces of the first and second wiring lines Wa and Wb. The protection layer 27 may include, for example, cobalt or cobalt silicide. An upper etch stop layer 29 covers the protection layer 27 and the upper interlayer insulation layer 15. The upper etch stop layer 29 may include, for example, silicon nitride. The via plug Va may have a rectangular pillar shape as shown in FIG. 2. In some embodiments, the via plug Va may have a circular pillar shape.

FIGS. 3 to 9 are cross-sectional views illustrating stages in a method of manufacturing a semiconductor device according to example embodiments.

Figure 3:
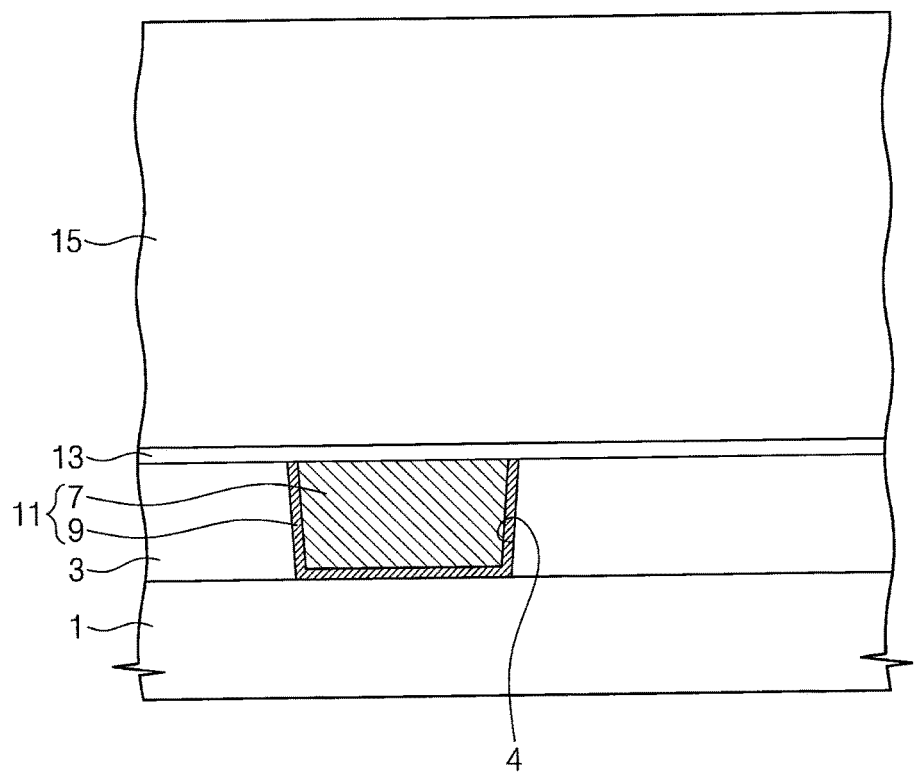
FIGS. 3 to 9 are cross-sectional views illustrating stages in a method of manufacturing a semiconductor device according to example embodiments.

Referring to FIG. 3, the semiconductor substrate 1 is prepared. The semiconductor substrate 1 may be, for example, a mono-crystalline silicon substrate. The lower interlayer insulation layer 3 is formed on the semiconductor substrate 1. The lower interlayer insulation layer 3 may be a porous low-k dielectric layer, for example, a SiOH layer. The lower interlayer insulation layer 3 may be patterned to form a trench 4. A lower diffusion prevention layer may be conformally formed on the semiconductor substrate 1, and then a lower conductive layer may be formed on the lower diffusion prevention layer to fill the trench 4. A planarization process may be performed on the lower conductive layer and the lower diffusion prevention layer to expose an upper surface of the lower interlayer insulation layer 3, such that the lower diffusion prevention pattern 9 and the lower conductive pattern 11 including the lower conductive part 7 are formed in the trench 4. For example, the lower conductive pattern 11 may be formed after forming the lower interlayer insulation layer 3. In some embodiments, the lower interlayer insulation layer 3 may be formed after forming the lower conductive pattern 11. In this case, a structure of the lower conductive pattern 11 may be changed, and may be formed by stacking a conductive layer on the semiconductor substrate 1 and patterning the conductive layer.

The lower etch stop layer 13 is formed on the lower interlayer insulation layer 3 and the lower conductive pattern 11. The lower etch stop layer 13 may be formed of, for example, silicon nitride. The upper interlayer insulation layer 15 is formed on the lower etch stop layer 13. The upper interlayer insulation layer 15 may be formed of a porous low-k dielectric material, for example, SiOCH.

Figure 4:
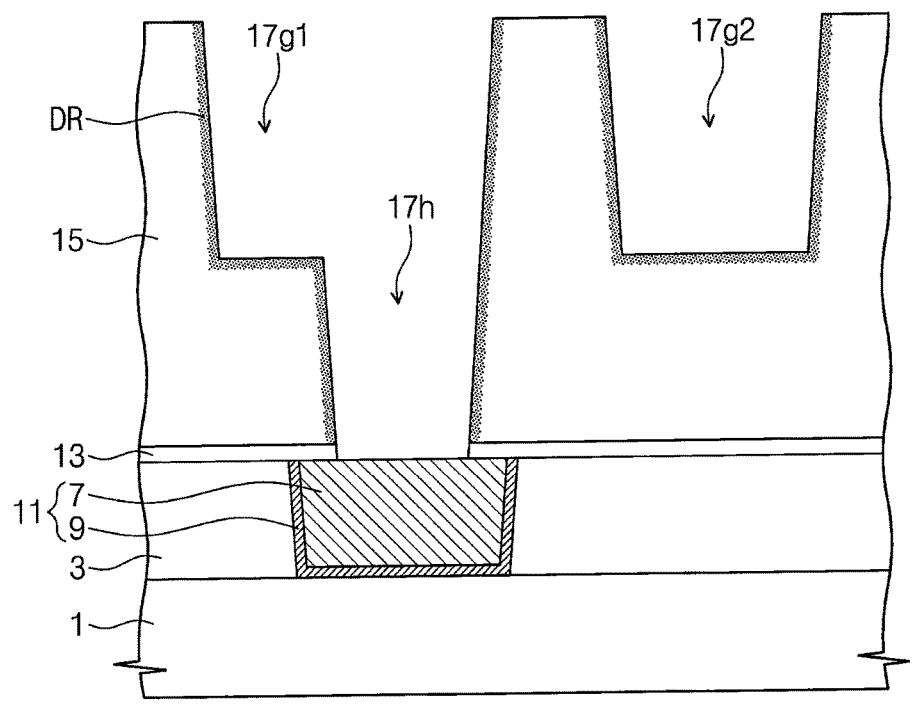

Referring to FIG. 4, the lower interlayer insulation layer 3 and the lower etch stop layer 13 are sequentially etched to form the via hole 17h, the first groove 17g1 overlapping the via hole 17h, and the second groove 17g2 spaced apart from the first groove 17g1. For example, after the via hole 17h is partly formed in the lower interlayer insulation layer 3 not to expose the lower conductive pattern 11, the first and second grooves 17g1 and 17g2 may be formed while completely forming the via hole 17h to expose the lower conductive pattern 11. In some embodiments, after the first and second grooves 17g1 and 17g2 are formed, a portion of the lower interlayer insulation layer 3 exposed by the first groove 17g1 and a portion of the lower etch stop layer 13 below the lower interlayer insulation layer 3 may be etched to form the via hole 17h below the first groove 17g1. The via hole 17h may expose the lower conductive pattern 11 and also a sidewall of the lower etch stop layer 13. A damaged region DR that is etch-damaged is formed in a surface of the upper interlayer insulation layer 15 that is exposed by the first and second grooves 17g1 and 17g2 and the via hole 17h. The damaged region DR may be formed in a portion of the upper interlayer insulation layer 15 affected by a plasma dry etching process. In the plasma dry etching process, oxygen or hydrogen may be supplied. The oxygen or the hydrogen may react with carbon atoms contained in the upper interlayer insulation layer 15 that may be SiOCH, to produce $CO_2$ or $CH_4$ that is gaseous, and to remove carbon atoms from the damaged region DR. Thus, the damaged region DR may have a carbon concentration lower than a carbon concentration in a remaining portion of the upper interlayer insulation layer 15 that is undamaged. The damaged region DR may have an oxygen concentration higher than an oxygen concentration in the remaining portion of the upper interlayer insulation layer 15 that is undamaged.

Figure 5:
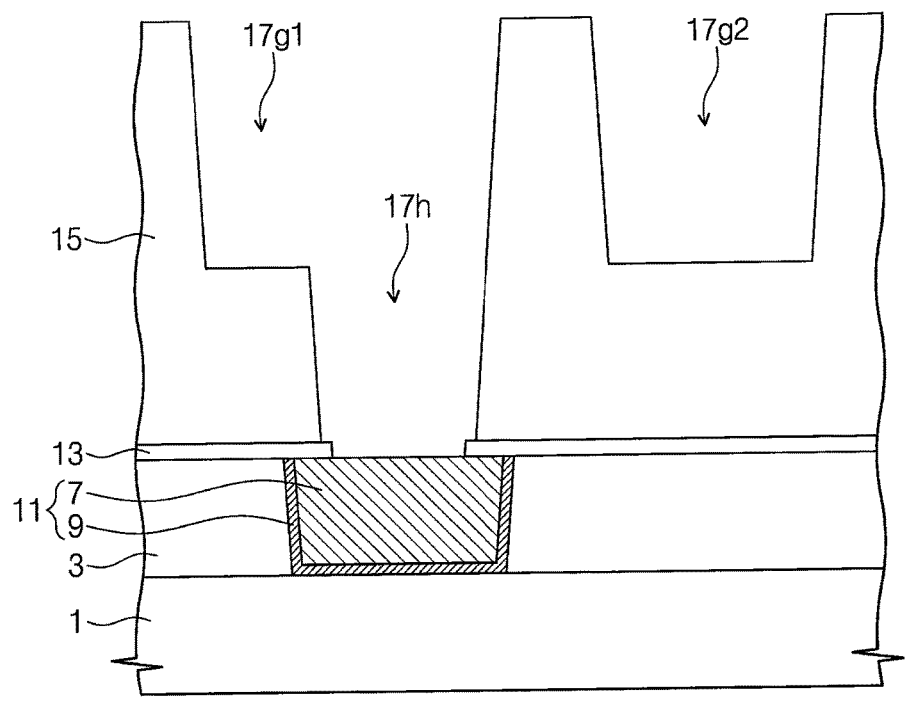

Referring to FIG. 5, the damaged region DR is removed. The damaged region DR may be removed by, for example, a dry/wet etching process using hydrofluoric acid. Thus, a portion of the upper interlayer insulation layer 15 may be removed, and a portion of an upper surface of the lower etch stop layer 13 may be exposed.

Figure 6:
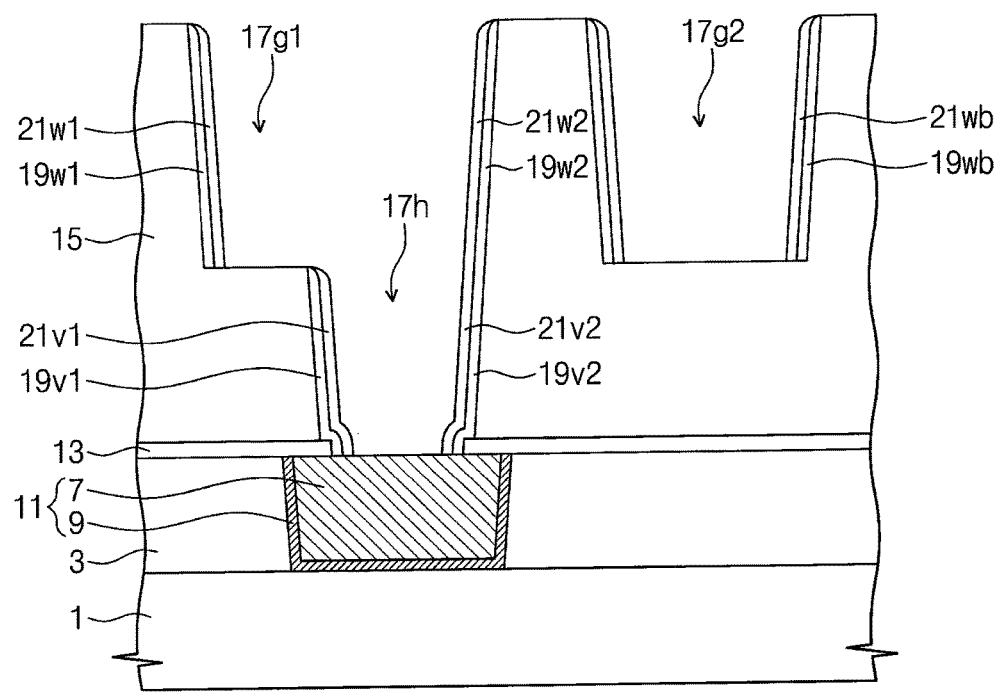

Referring to FIG. 6, a sacrificial spacer layer may be conformally formed on the semiconductor substrate 1 and then be anisotropically etched, such that sacrificial spacers 19v1, 19v2, 19w1, 19w2, and/or 19wb are formed. The sacrificial spacers 19v1, 19v2, 19w1, 19w2, and/or 19wb include a first via sacrificial spacer 19v1 covering a sidewall of the via hole 17h, a second via sacrificial spacer 19v2 opposite to the first via sacrificial spacer 19v1, a first wiring sacrificial spacer 19w1 covering a sidewall of the first groove 17g1, a second wiring sacrificial spacer 19w2 opposite to the first wiring sacrificial spacer 19w1, and a third wiring sacrificial spacer 19wb covering a sidewall of the second groove 17g2. The sacrificial spacers 19v1, 19v2, 19w1, 19w2, and/or 19wb may be formed of a material having an etch selectivity with respect to the upper interlayer insulation layer 15, the lower etch stop layer 13, and/or insulation liners 21v1, 21v2, 21w1, 21w2, and/or 21wb that are to be formed later. The sacrificial spacers 19v1, 19v2, 19w1, 19w2, and/or 19wb may be formed of, for example, silicon oxide. The second via sacrificial spacer 19v2 and the second wiring sacrificial spacer 19w2 may be integrally coupled to each other and extend in a line. The first via sacrificial spacer 19v1 and the second via sacrificial spacer 19v2 may be connected to each other while extending along an inner sidewall of the via hole 17h. The first wiring sacrificial spacer 19w1 may be isolated from the first and second via sacrificial spacers 19v1 and 19v2 and the second wiring sacrificial spacer 19w2.

An insulation liner layer may be conformally formed on the semiconductor substrate 1 having the sacrificial spacers 19v1, 19v2, 19w1, 19w2, and/or 19wb, and then be aniosotropically etched, such that the insulation liners 21v1, 21v2, 21w1, 21w2, and/or 21wb are formed. The insulation liners 21v1, 21v2, 21w1, 21w2, and/or 21wb include a first via insulation liner 21v1 covering a sidewall of the first via sacrificial spacer 19v1, a second via insulation liner 21v2 covering a sidewall of the second via sacrificial spacer 19v2, a first wiring insulation liner 21w1 covering a sidewall of the first wiring sacrificial spacer 19w1, a second wiring insulation liner 21w2 covering a sidewall of the second wiring sacrificial spacer 19w2, and a third wiring insulation liner 21wb covering a sidewall of the third wiring sacrificial spacer 19wb. The insulation liners 21v1, 21v2, 21w1, 21w2, and/or 21wb may be formed of, for example, silicon nitride, silicon carbonitride, and/or aluminum nitride. The second via insulation liner 21v2 and the second wiring insulation liner 21w2 may be integrally coupled with each other and extend in a line. The first via insulation liner 21v1 and the second via insulation liner 21v2 may be connected to each other while extending along the inner sidewall of the via hole 17h. The first via insulation liner 21v1 may be isolated from the first and second via insulation liners 21v1 and 21v2 and the second wiring insulation liner 21w2. As the insulation liners 21v1, 21v2, 21w1, 21w2, and 21wb are formed, a portion of the upper interlayer insulation layer 15 and an upper surface of the lower conductive pattern 11 may be exposed.

Figure 7:
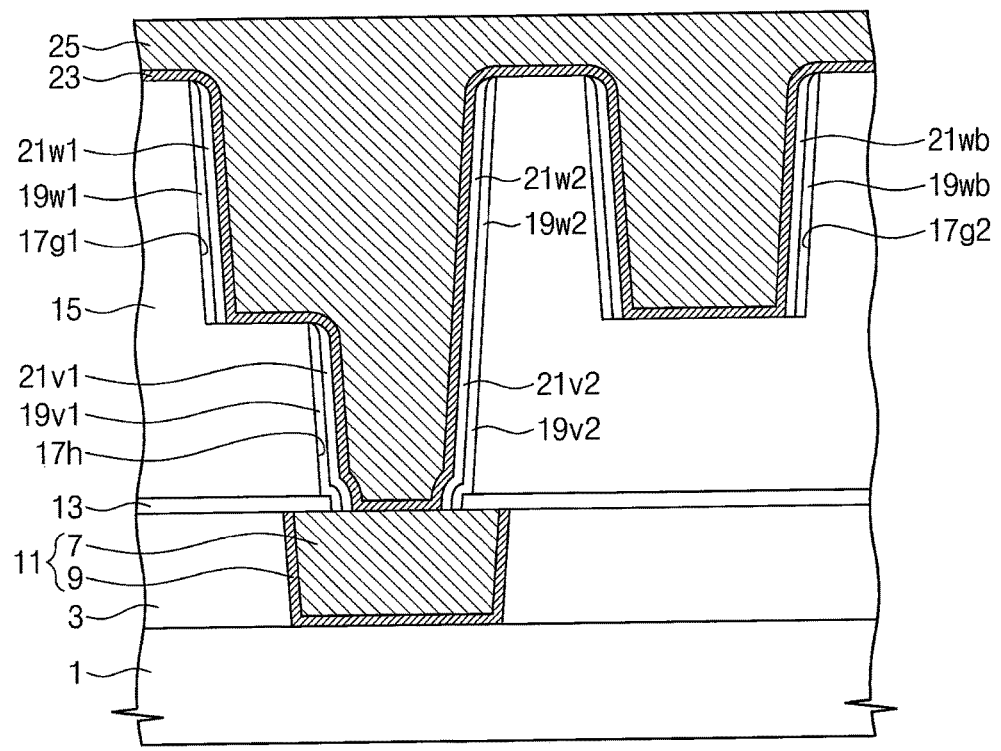

Referring to FIG. 7, a diffusion prevention layer 23 is conformally formed on the semiconductor substrate 1. The diffusion prevention layer 23 may contact the lower conductive pattern 11. The diffusion prevention layer 23 may be formed of, for example, titanium nitride or tantalum nitride. The diffusion prevention layer 23 may be formed by, for example. an atomic layer deposition process or a chemical vapor deposition process. An upper conductive layer 25 is formed on the diffusion prevention layer 23 to fill the via hole 17h and the first and second grooves 17g1 and 17g2. The upper conductive layer 25 may be formed of, for example, copper. The upper conductive layer 25 may be formed by an electroplating process or an electroless plating process. In this case, the diffusion prevention layer 23 may function as a seed layer.

Figure 8:
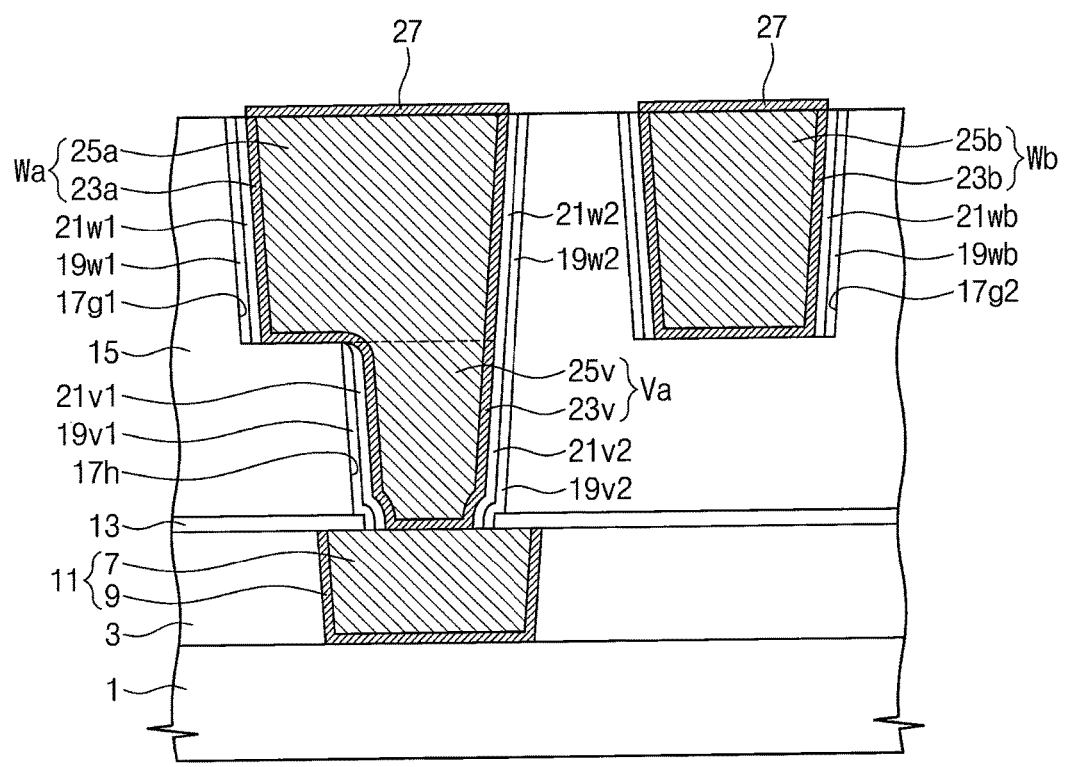

Referring to FIG. 8, a chemical mechanical polishing (CMP) process is performed to remove a portion of the upper interlayer insulation layer 15, a portion of the diffusion prevention layer 23, and a portion of the upper conductive layer 25, such that the via plug Va, the first wiring line Wa, and the second wiring line Wb are formed. At this time, upper portions of the first to third wiring insulation liners 21w1, 21w2, and/or 21wb and upper portions of the first to third wiring sacrificial spacers 19w1, 19w2, and/or 19wb may be removed, such that the first to third wiring insulation liners 21w1, 21w2, and/or 21wb and the first to third wiring sacrificial spacers 19w1, 19w2, and/or 19wb may be exposed. The protection layer 27 is formed on the first wiring line Wa and the second wiring line Wb. The protection layer 27 may be formed of, for example, cobalt or cobalt silicide. For example, the protection layer 27 may be formed by forming a cobalt layer on the upper interlayer insulation layer 15 having the first wiring line Wa and the second wiring line Wb therein, patterning the cobalt layer, forming a silicon layer on the patterned cobalt layer, performing a thermal treating process to form a cobalt silicide layer by reaction between the silicon layer and the cobalt layer; and removing the unreacted silicon layer.

Figure 9:
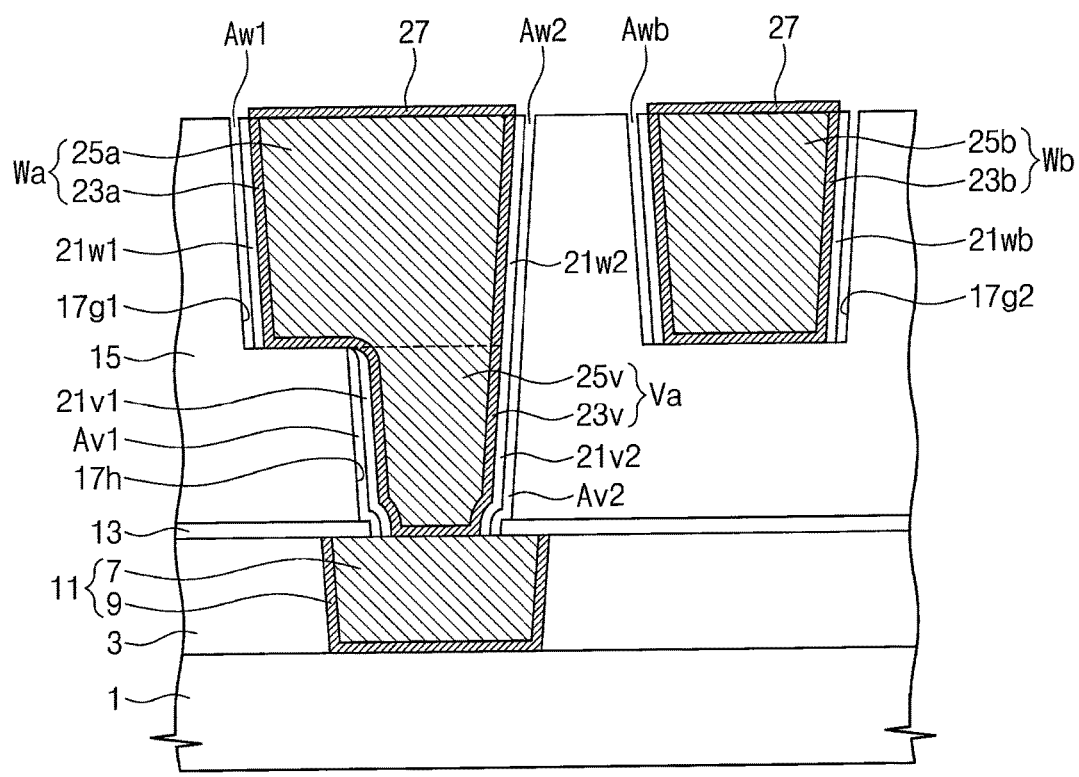

Referring to FIG. 9, the exposed first to third wiring sacrificial spacers 19w1, 19w2, and/or 19wb are removed to form the first, second, and third wiring air-gap regions Aw1, Aw2, and/or Awb. The first, second, and third wiring air-gap regions Aw1, Aw2, and/or Awb may be removed by a dry/wet etching process using, for example, hydrofluoric acid. The etching process may be successively performed to remove the first and second via sacrificial spacers 19v1 and/or 19v2 as well as the first to third wiring sacrificial spacers 19w1, 19w2, and/or 19wb. Since the first and second via sacrificial spacers 19v1 and 19v2 are connected to the second wiring sacrificial spacer 19w2, the first and second via sacrificial spacers 19v1 and 19v2 may be removed according to a penetration depth of the hydrofluoric acid. The first and second air-gap regions Av1 and Av2 are formed in regions from which the first and second via sacrificial spacers 19v1 and 19v2 are removed, The protection layer 27 may protect the first and second wiring lines Wa and Wb from damages caused by the hydrofluoric acid during the etching process. A size of each of the air-gap regions Av1, Av2, Aw1, Aw2, and/or Awb may be adjusted according to a thickness of the sacrificial spacer layer.

Referring again to FIG. 1, the upper etch stop layer 29 is formed on the upper interlayer insulation layer 15 and the protection layer 27. The upper etch stop layer 29 may be formed of, for example, silicon nitride. The upper etch stop layer 29 may cover upper entrances of the first to third wiring air-gap regions Aw1, Aw2, and Awb.

Figure 10:
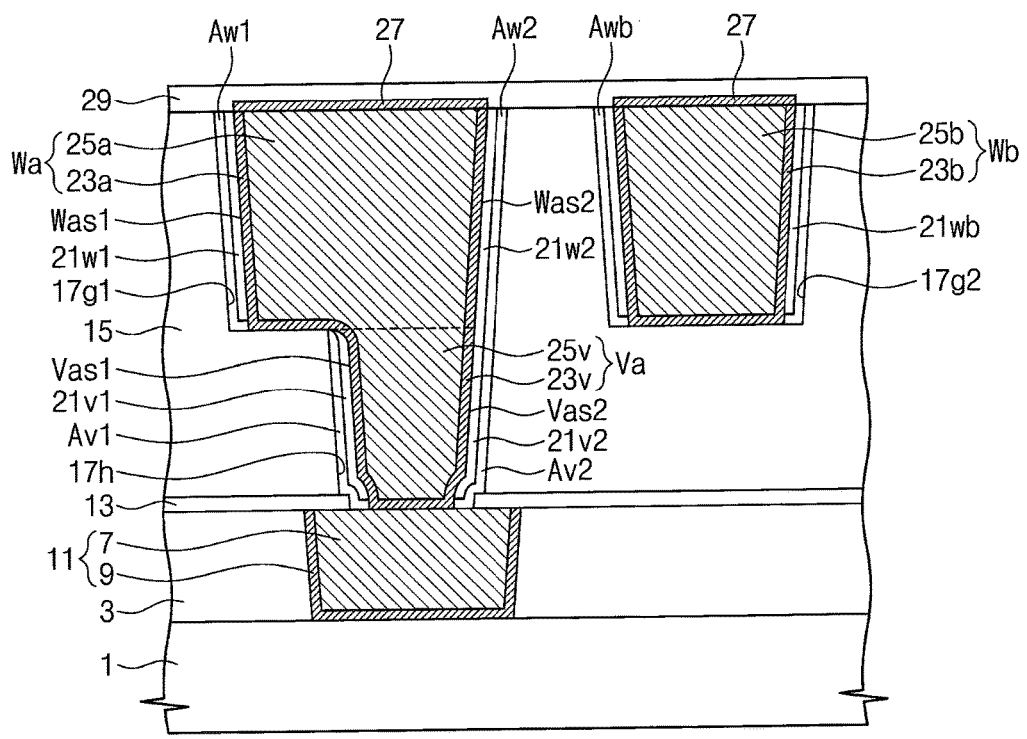
FIG. 10 is a cross-sectional view of a semiconductor device according to example embodiments.

FIG. 10 is a cross-sectional view of a semiconductor device according to example embodiments. Differences between the present embodiment and the embodiments of FIGS. 1 to 9 are mainly described.

Referring to FIG. 10, in a semiconductor device according to example embodiments, each of the first and second via insulation liners 21v1 and 21v2 cover the sidewall of the via plug Va, but exposes a lower portion of the sidewall of the via plug Va. The first wiring insulation liner 21w1 exposes a lower portion of the first wiring sidewall Was1 of the first wiring line Wa. The third wiring insulation liner 21wb exposes a lower portion of the sidewall of the second wiring line Wb. Each of the first and second via air-gap regions Av1 and Av2, the first wiring air-gap region Aw1, and the third wiring air-gap region Awb may have an L-shaped cross-section.

A method of manufacturing the semiconductor device of FIG. 10 includes sequentially forming the sacrificial spacer layer and the insulation liner layer on the structure of FIG. 5, anisotropically etching the sacrificial spacer layer and the insulation liner layer to from the sacrificial spacers 19v1, 19v2, 19w1, 19w2, and/or 19wb and the insulation liners 21v1, 21v2, 21w1, 21w2, and/or 21wb at the same time. Thereafter, the processes as described with reference to FIGS. 6 to 9 may be performed.

Figure 11:
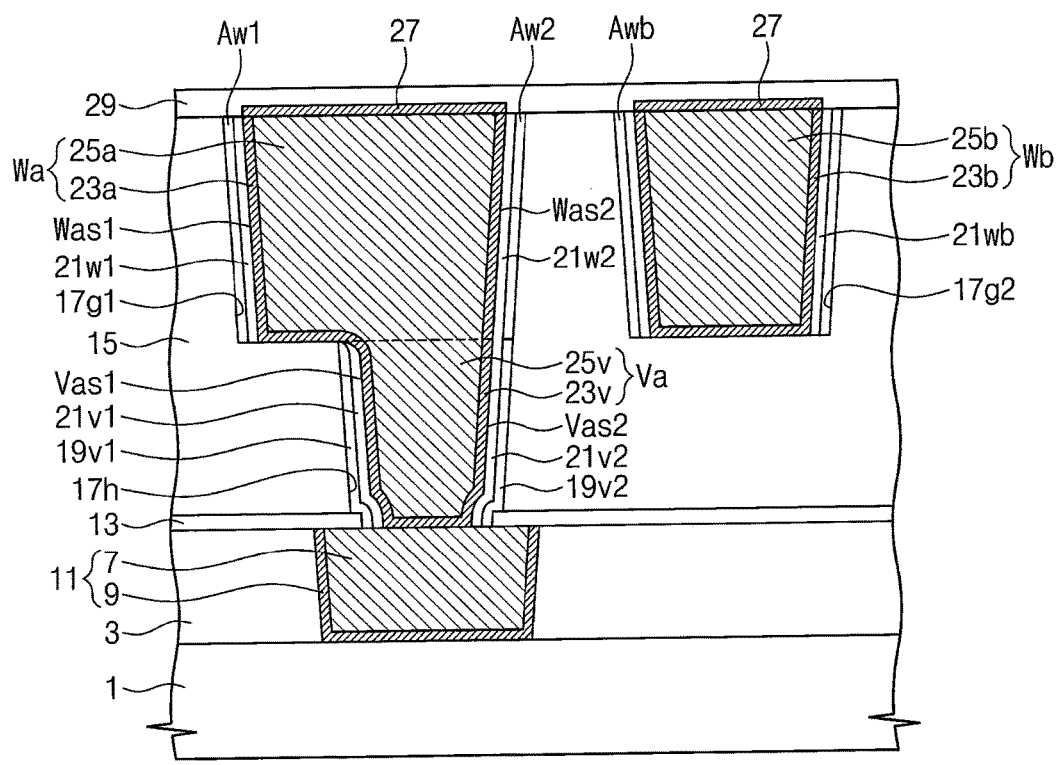
FIG. 11 is a cross-sectional view of a semiconductor device according to example embodiments.

FIG. 11 is a cross-sectional view of a semiconductor device according to example embodiments. Differences between the present embodiment and the embodiments of FIGS. 1 to 9 are mainly described.

Referring to FIG. 11, in a semiconductor device according to example embodiments, the first and second via air-gap regions Av1 and Av2 are not present, but the first and second via sacrificial spacers 19v1 and 19v2 remain. For example, after performing the process as shown in FIG. 8, the first to third wiring sacrificial spacers 19w1, 19w2, and 19wb are removed, but the first and second via sacrificial spacers 19v1 and 19v2 are left unremoved, such that the first and second via air-gap regions Av1 and Av2 are not formed.

Figure 12:
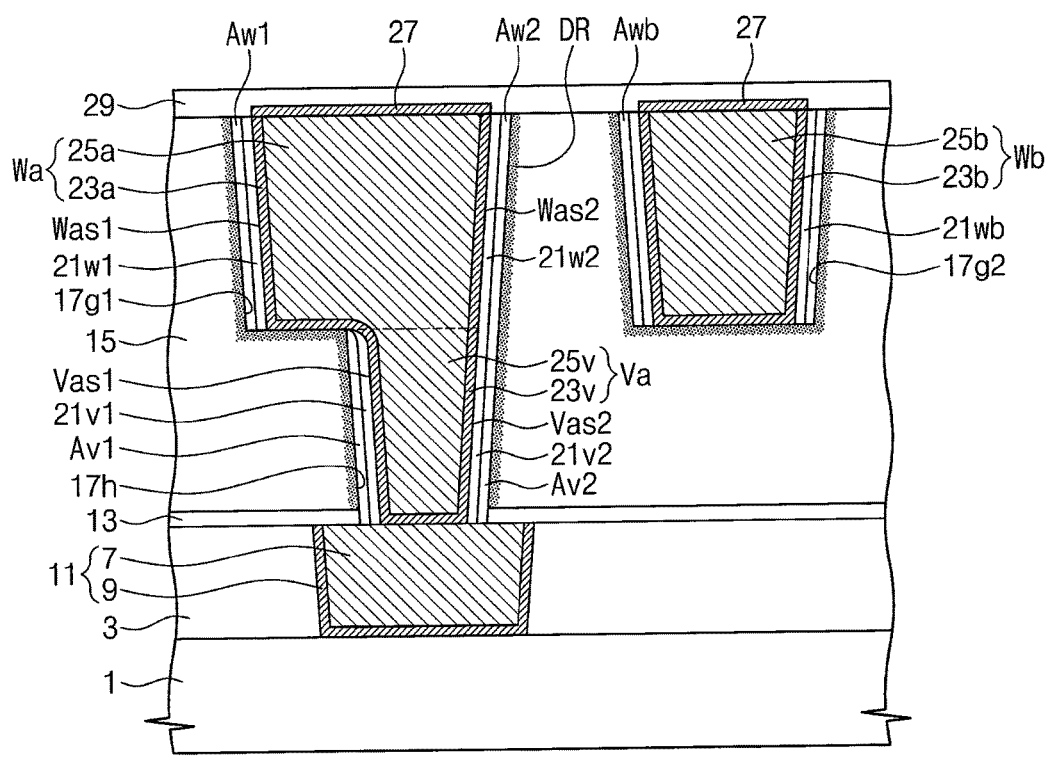
FIG. 12 is a cross-sectional view of a semiconductor device according to example embodiments.

FIG. 12 is a cross-sectional view of a semiconductor device according to example embodiments. Differences between the present embodiment and the embodiments of FIGS. 1 and 2 are mainly described.

Referring to FIG. 12, in a semiconductor device according to example embodiments, the damaged region DR is disposed adjacent to a surface of the upper interlayer insulation layer 15 exposed by the air-gap regions Av1 Av2 Aw1, Aw2, and Awb. A carbon concentration in the damaged region DR may be lower than a carbon concentration in the upper interlayer insulation layer 15. An oxygen concentration in the damaged region DR may be higher than an oxygen concentration in the upper interlayer insulation layer 15. The first and second via air-gap regions Av1 and Av2 may not expose the upper surface of the lower etch stop layer 13. The sidewall of the lower etch stop layer 13 may be aligned with a sidewall of the upper interlayer insulation layer 15 exposed by the first and second air-gap regions Av1 and Av2.

Figure 13:
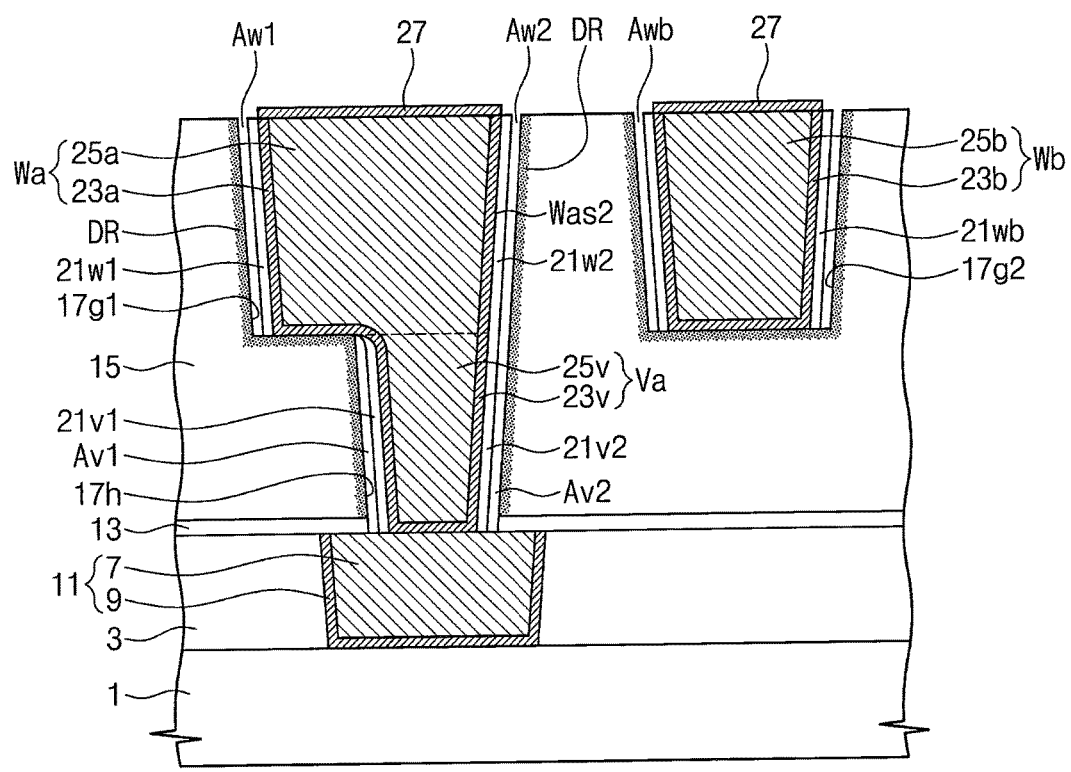
FIG. 13 is a cross-sectional view illustrating a method of manufacturing the semiconductor device of FIG. 12 according to example embodiments.

FIG. 13 is a cross-sectional view illustrating a method of manufacturing the semiconductor device of FIG. 12 according to example embodiments. Differences between the present embodiment and the embodiments of FIGS. 3 to 9 are mainly described.

Referring to FIG. 13, the damaged region DR shown in FIG. 4 is left unremoved, by omitting the process as shown in FIG. 5, and then the processes as shown in FIGS. 6 to 8 are performed. The first to third wiring sacrificial spacers 19w1, 19w2, and/or 19wb and the first and second via sacrificial spacers 19v1 and/or 19v2 may be removed by performing a dry/wet etching process using hydrofluoric acid. At this time, since the damaged region DR includes carbon more than that in the sacrificial spacers 19w1, 19w2, 19wb, 19v1, and/or 19v2 that are formed of silicon oxide, the etch rate of the damaged region DR by the hydrofluoric acid may be lowered. Thus, the etching process is interrupted after the damaged region DR is removed by the hydrofluoric acid, to leave the damaged region DR. The following processes may be performed.

Figure 14:
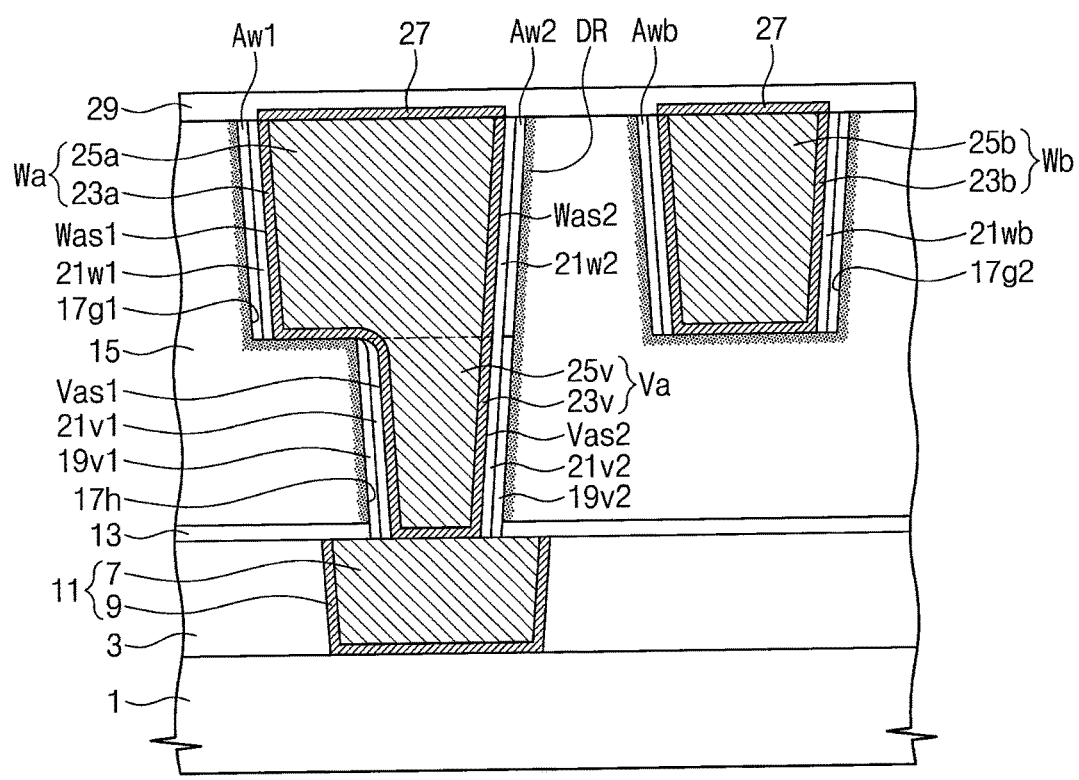
FIG. 14 is a cross-sectional view of a semiconductor device according to example embodiments.

FIG. 14 is a cross-sectional view of a semiconductor device according to example embodiments. Differences between the present embodiment and the embodiments of FIGS. 1 and 2 are mainly described.

Referring to FIG. 14, a semiconductor device according to example embodiments includes a combination structure of the semiconductor device of FIG. 11 and the semiconductor device of FIG. 12. In the semiconductor device, the damaged region DR is disposed in a portion of the upper interlayer insulation layer 15 adjacent to the inner sidewall of the via hole 17h and the inner sidewalls of the first and second grooves 17g1 and 17g2. The first and second via sacrificial spacers 19v1 and 19v2 are left unremoved. Thus, the first and second via air-gap regions Av1 and Av2 may not be formed, unlike those of FIGS. 1 and 2. A carbon concentration in the damaged region DR may be lower than that in the upper interlayer insulation layer 15 and be higher than that in each of the first and second via sacrificial spacers 19v1 and 19v2. An oxygen concentration in the damaged region DR may be higher than that in the upper interlayer insulation layer 15 and be lower than that in each of the first and second via sacrificial spacers 19v1 and 19v2.

Figure 15:
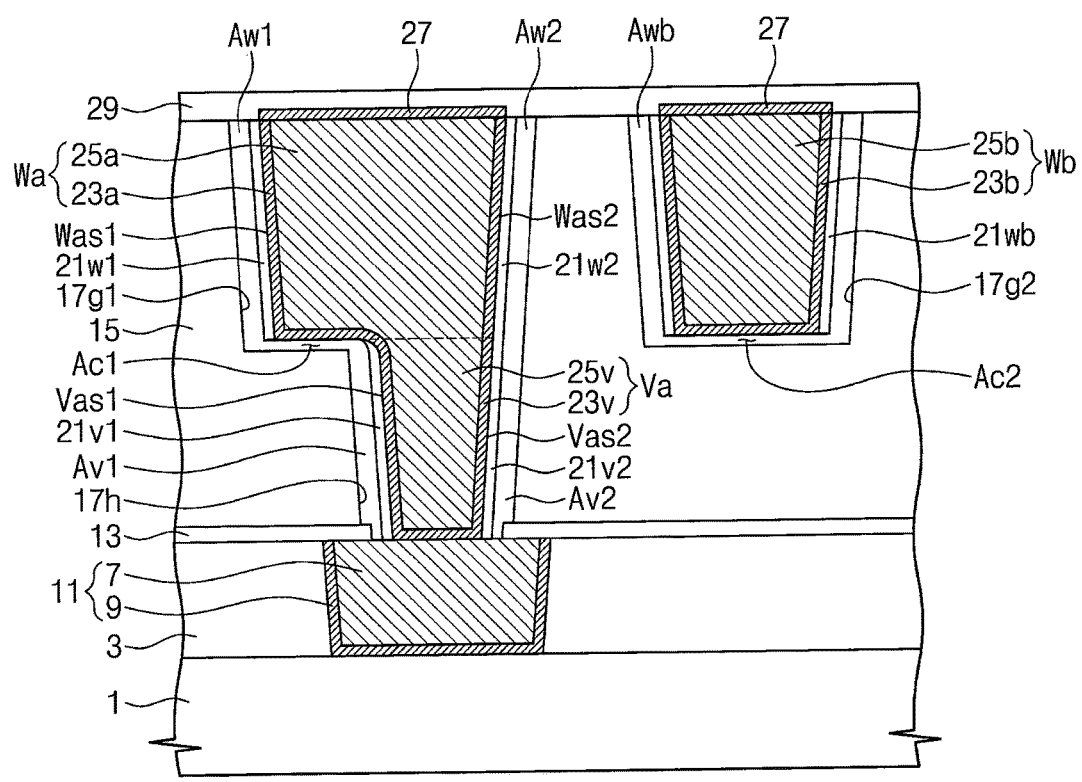
FIG. 15 is a cross-sectional view of a semiconductor device according to example embodiments.

FIG. 15 is a cross-sectional view of a semiconductor device according to example embodiments. Differences between the present embodiment and the embodiments of FIGS. 1 and 2 are mainly described.

Referring to FIG. 15. in a semiconductor device according to example embodiments, a horizontal width of each of the air-gap regions, Av1, Av2, Aw1, Aw2, and/or Awb is greater than that of each of those of FIG. 1. A first connection air-gap region Ac1 is disposed to connect the first via air-gap region Av1 and the first wiring air-gap region Aw1 and exposes the lower surface of the first wiring line Wa. The lower surface of the first wiring line Wa may be spaced apart from the upper interlayer insulation layer 15 by the first connection air-gap region Ac1. A second connection air-gap region Ac2 is disposed to connect third wiring air-gap regions Awb and exposes a lower surface of the second wiring line Wb. The lower surface of the second wiring line Wb may be spaced apart from the upper interlayer insulation layer 15 by the second connection air-gap region Ac2. The first and second connection air-gap regions Ac1 and Ac2 may be parallel to the upper surface of the semiconductor substrate 1. A vertical width of each of the first and second connection regions Ac1 and Ac2 may be smaller than the horizontal width of each of the other air-gap regions Av1, Av2, Aw1, Aw2, and/or Awb.

Figure 16:
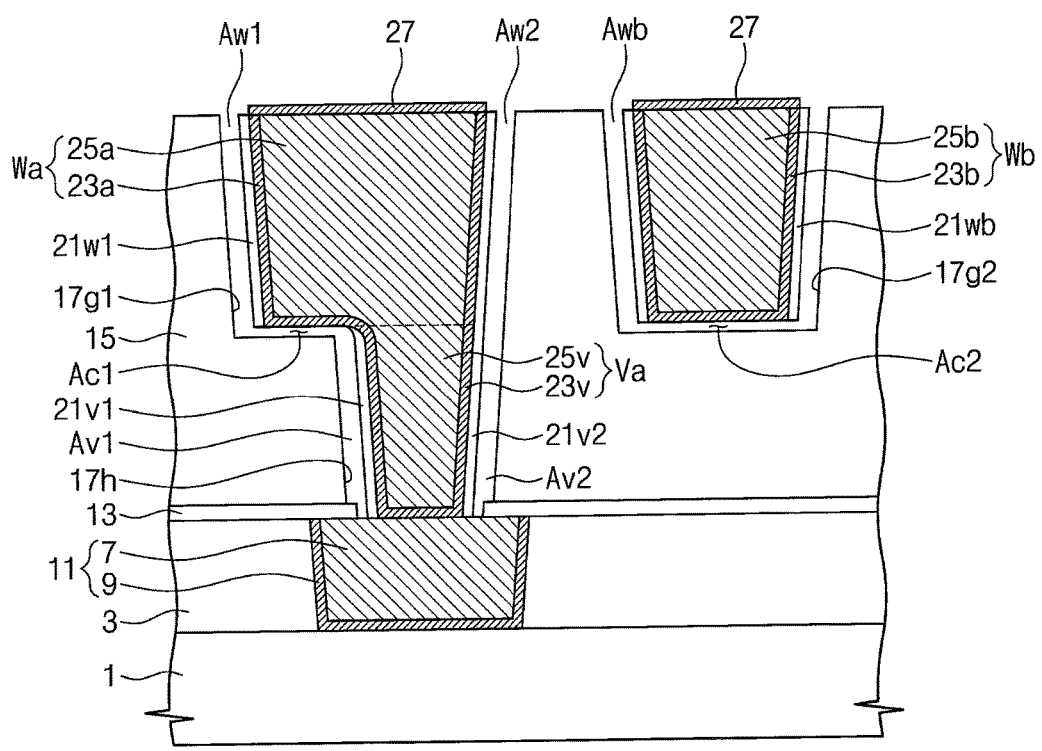
FIG. 16 is a cross-sectional view illustrating in a method of manufacturing the semiconductor device of FIG. 15 according to example embodiments.

FIG. 16 is a cross-sectional view illustrating a method of manufacturing the semiconductor device of FIG. 15 according to example embodiments. Differences between the present embodiment and the embodiments of FIGS. 3 to 9, and 13 are mainly described.

Referring to FIG. 16, the damaged region D2 in the same structure as shown in FIG. 13 is removed by further performing the dry/etching process using the hydrofluoric acid. Thus, the air-gap regions Av1, Av2, Aw1, Aw2, and/or Awb are enlarged, and the connection air-gap regions Ac1 and Ac2 also are formed. In some embodiments, the second wiring line Wb may include an extension portion connected to another via plug, and thus be supported thereby.

Figure 17:
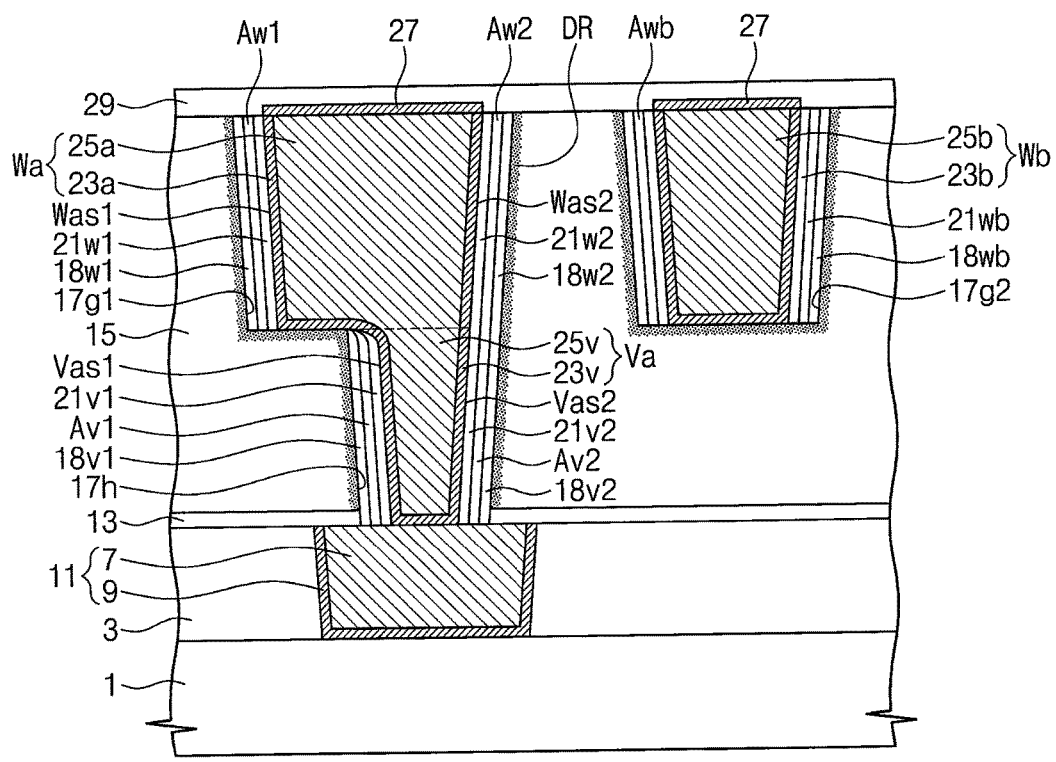
FIG. 17 is a cross-sectional view of a semiconductor device according to example embodiments.

FIG. 17 is a cross-sectional view of a semiconductor device according to example embodiments. Differences between the present embodiment and the embodiments of FIGS. 1 to 9, and 12 are mainly described.

Referring to FIG. 17, in a semiconductor device according to example embodiments, supplementary insulation liners 18v1, 18v2, 18w1, 18w2, and/or 18wb are respectively disposed to be opposite to the insulation liners 21v1, 21v2, 21w1, 21w2, and/or 21wb with the air-gap regions Av1, Av2, Aw1, Aw2, and/or Awb therebetween. The supplementary insulation liners 18v1, 18v2, 18w1, 18w2, and/or 18wb include a first via supplementary insulation liner 18v1 exposed by the first via air-gap region Av1, a second via supplementary insulation liner 18v2 exposed by the second via air-gap region Av2, a first wiring supplementary insulation liner 18w1 exposed by the first wiring air-gap region Aw1, a second wiring supplementary insulation liner 18w2 exposed by the second wiring air-gap region Aw2, and a third wiring supplementary insulation liner 18wb exposed by the third wiring air-gap region Awb. The first and second via supplementary insulation liners 18v1 and 18v2 may cover the sidewall of the lower etch stop layer 13. The supplementary insulation liners 18v1, 18v2, 18w1, 18w2, and/or 18wb may include the same material as the insulation liners 21v1, 21v2, 21w1, 21w2, and/or 21wb.

A method of manufacturing the semiconductor device of FIG. 17 includes conformally forming a supplementary liner layer on the semiconductor substrate 1 having the resulting structure including the damaged region DR as shown in FIG. 4, without performing the process of removing the damaged region DR as shown in FIG. 5, and anisotropically etching the supplementary liner layer to form the supplementary insulation liners 18v1, 18v2, 18w1, 18w2, and/or 18wb.

Figure 18:
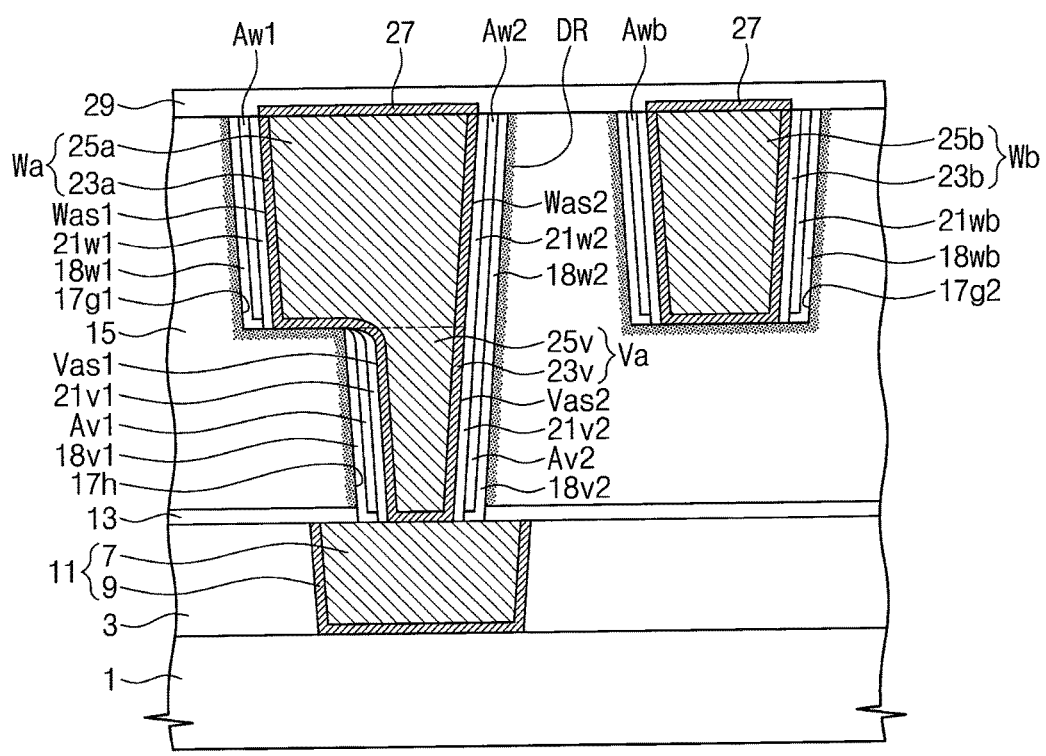
FIGS. 18 and 19 are cross-sectional views of a semiconductor device according to example embodiments.
Figure 19:
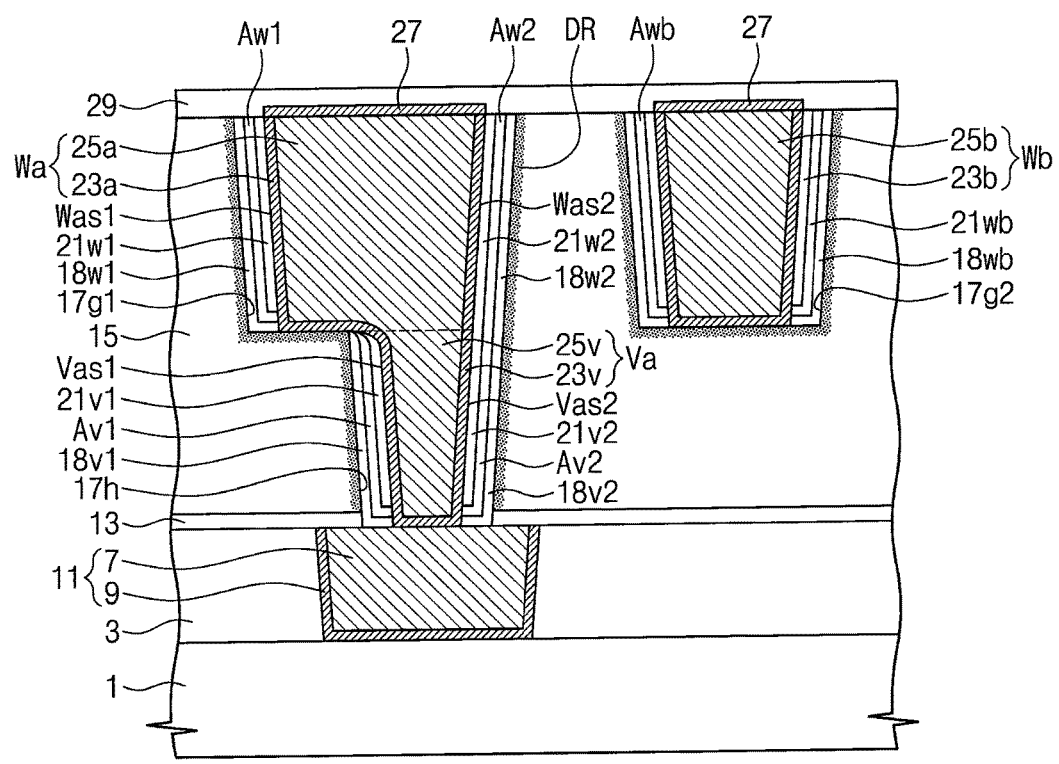

FIGS. 18 and 19 are cross-sectional views of a semiconductor device according to example embodiments. Differences between the present embodiments and the embodiments of FIGS. 1 to 9, and 17 are mainly described.

Referring to FIG. 18, in a semiconductor device according to example embodiments, each of the first and second via supplementary insulation liners 18v1 and 18v2 and the first and third wiring supplementary insulation liners 18w1 and 18wb has an L-shaped cross-section. Lower end portions of the first and second via supplementary insulation liners 18v1 and 18v2 and lower end portions of the first and third wiring supplementary insulation liners 18w1 and 18wb may respectively contact the first and second via insulation liners 21v1 and 21v2 and the first and third wiring insulation liners 21w1 and 21wb. Lower portions of the air-gap regions Av1, Av2, Aw1, Aw2, and/or Awb may respectively be confined by the first and second via supplementary insulation liners 18v1 and 18v2 and the first and third wiring supplementary insulation liners 18w1 and 18wb.

A method of manufacturing the semiconductor device of FIG. 18 includes sequentially conformally forming a supplementary liner insulation layer and the sacrificial spacer layer on the semiconductor substrate 1 having the resulting structure as shown in FIG. 4 and anisotropically etching the supplementary liner layer and the sacrificial spacer layer to form the supplementary insulation liners 18v1, 18v2, 18w1, 18w2, and 18wb and the sacrificial spacers 19v1, 19v2, 19w1, 19w2, and 19wb.

Referring to FIG. 19, in a semiconductor device according to example embodiments, each of the first and second via supplementary insulation liners 18v1 and 18v2 and the first and third wiring supplementary insulation liners 18w1 and 18wb has an L-shaped cross-section. Each of the first and second via air-gap regions Av1 and Av2 and the first and third air-gap regions Aw1 and Aw2 also has an L-shaped cross-section.

A method of manufacturing the semiconductor device of FIG. 19 includes sequentially conformally forming the supplementary liner insulation layer, the sacrificial spacer layer, and the insulation liner layer on the semiconductor substrate 1 having the resulting structure as shown in FIG. 4 and anisotropically etching the supplementary liner layer, the sacrificial spacer layer, and the insulation liner layer to form the supplementary insulation liners 18v1, 18v2, 18w1, 18w2, and/or 18wb, the sacrificial spacers 19v1, 19v2, 19w1, 19w2, and/or 19wb, and the insulation liners 21v1, 21v2, 21w1, 21w2, and/or 21wb.

Figure 20:
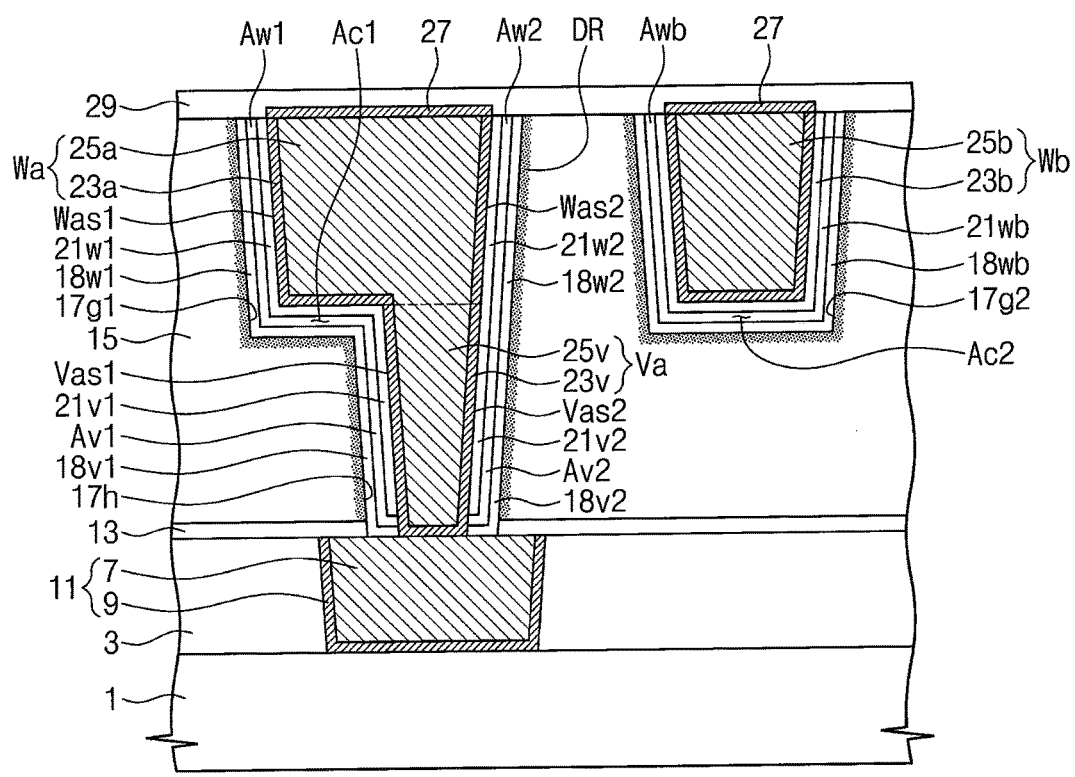
FIG. 20 is a cross-sectional view of a semiconductor device according to example embodiments.

FIG. 20 is a cross-sectional view of a semiconductor device according to example embodiments. Differences between the present embodiment and the embodiments of FIGS. 1, 2, and 19 are mainly described.

Referring to FIG. 20, in a semiconductor device according to example embodiments, the first via supplementary insulation liner 18v1 is connected to the first wiring supplementary insulation liner 18w1. A portion of the first via supplementary insulation liner 18v1 or a portion of the first wiring supplementary insulation liner 18w1 may extend below the lower surface of the first wiring line Wa. The first via insulation liner 21v1 is connected to the first wiring insulation liner 21w1. A portion of the first via insulation liner 21v1 or a portion of the first wiring insulation liner 21w1 may extend below the lower surface of the first wiring line Wa. The first connection air-gap region Ac1 is disposed below the lower surface of the first wiring line Wa to connect the first via air-gap region Av1 and the first wiring air-gap region Aw1. The third wiring supplementary insulation liner 18wb and the third wiring insulation liner 21wb extend below the lower surface of the second wiring line Wb. The second connection air-gap region Ac2 is disposed between the third wiring supplementary insulation liner 18wb and the third wiring insulation liner 21wb.

Figure 21:
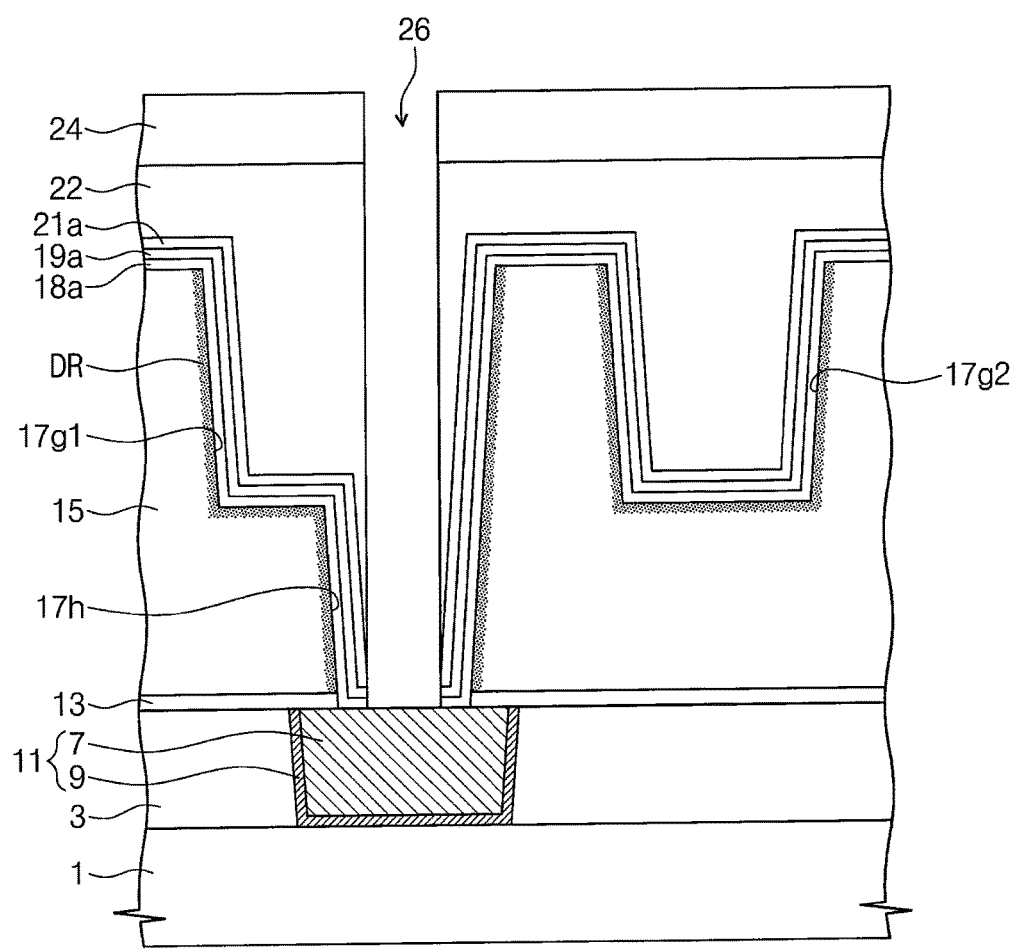
FIG. 21 is a cross-sectional view illustrating a method of manufacturing the semiconductor device of FIG. 20 according to example embodiments.

FIG. 21 is a cross-sectional view illustrating a method of manufacturing the semiconductor device of FIG. 20 according to example embodiments. Differences between the present embodiment and the embodiments of FIGS. 3 to 9, and 19 are mainly described.

Referring to FIG. 21, a supplementary insulation liner layer 18a, a sacrificial spacer layer 19a, and an insulation liner layer 21a are sequentially conformally formed on the semiconductor substrate 1 having the resulting structure as shown in FIG. 4. A sacrificial layer 22 is formed on the semiconductor substrate 1 to fill the via hole 17h and the first and second grooves 17g1 and 17g2. The sacrificial layer 22 may be formed to have a planar upper surface. The sacrificial layer 22 may be formed of a material having an etch selectivity with respect to the supplementary insulation liner layer 18a, the sacrificial spacer layer 19a, and the insulation liner layer 21a. For example, the sacrificial layer 22 may be formed of a spin on hard mask (SOH) layer or a spin on carbon (SOC) layer. A mask pattern 24 is formed on the sacrificial layer 22. The mask pattern 24 may be, for example, a photoresist pattern. The mask pattern 24 includes an opening 26 overlapping the via hole 17h. The sacrificial layer 22 may be patterned using the mask pattern 24 as an etch mask such that the opening 26 is extended into the sacrificial layer 22 to expose the insulation liner layer 21a on a lower surface of the via hole 17h. The insulation liner layer 21a, the sacrificial spacer layer 19a, and the supplementary insulation liner layer 18a which are exposed by the extended opening 26 may be sequentially patterned using the sacrificial layer 22 as an etch mask to expose the lower conductive pattern 11. The mask pattern 24 and the sacrificial layer 22 may be removed to expose the insulation liner layer 21a. Thereafter, the same processes as shown in FIGS. 7 to 9 may be performed.

The air-gap regions may be formed around adjacent wiring lines by the aforementioned various methods. Since the air-gap regions have a low dielectric constant, a parasitic capacitance between adjacent wiring lines is reduced. Accordingly, a signal transmission speed may be increased.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:
1. A semiconductor device comprising:
an interlayer insulation layer on a substrate;
a via plug in the interlayer insulation layer, the via plug having opposite first and second via sidewalls;
a first wiring line in the interlayer insulation layer, the first wiring line coupled with the via plug and having a first wiring sidewall adjacent to the first via sidewall and a second wiring sidewall opposite to the first wiring sidewall and adjacent to the second via sidewall;

a first via insulation liner covering the first via sidewall;

a first wiring insulation liner covering the first wiring sidewall;

a first via air-gap region between the first via insulation liner and the interlayer insulation layer, the first via air-gap region exposing the first via insulation liner to the interlayer insulation layer; and a first wiring air-gap region between the first wiring insulation liner and the interlayer insulation layer, the first wiring air-gap region exposing the first wiring insulation liner to the interlayer insulation layer;

wherein the first via sidewall and the second wiring sidewall are misaligned with each other.

2. The semiconductor device according to claim 1, wherein the first wiring air-gap region does not vertically overlap with the first via air-gap region, and wherein the first wiring insulation liner is separated from the interlayer insulation layer by the first wiring air-gap region.

3. The semiconductor device according to claim 2, further comprising:

a connection air-gap region connecting the first wiring air-gap region and the first via air-gap region and exposing a portion of a lower surface of the first wiring line to the interlayer insulation layer.

4. The semiconductor device according to claim 3, wherein a vertical width of the connection air-gap region is smaller than a horizontal width of the first wiring air-gap region.

5. The semiconductor device according to claim 1, further comprising:

an etch stop layer between the interlayer insulating layer and the substrate, wherein the first via air-gap region extends between the etch stop layer and the via plug, and wherein a portion of an upper surface and a sidewall of the etch stop layer is exposed to the first via air-gap region.

6. The semiconductor device according to claim 1, wherein the second via sidewall and the second wiring sidewall are directly connected to each other and extend in a line.

7. The semiconductor device according to claim 6, further comprising:

a second via air-gap region between the second via sidewall and the interlayer insulation layer; and a second wiring air-gap region between the second wiring sidewall and the interlayer insulation layer, wherein the second via air-gap region and the second wiring air-gap region are directly connected with each other.

8. The semiconductor device according to claim 1, wherein a portion of a lower surface of the first wiring line contacts the interlayer insulation layer between the first via air-gap region and the first wiring air-gap region.

9. The semiconductor device according to claim 1, wherein the interlayer insulation layer is exposed by the first via air-gap region to the first via insulation liner, and wherein the interlayer insulation layer is exposed by the first wiring air-gap region to the first wiring line.

10. The semiconductor device according to claim 1, further comprising:

a second via insulation liner opposite to the first via insulation liner with the first via air-gap region therebetween; and a second wiring insulation liner opposite to the first wiring insulation liner with the first wiring air-gap region therebetween.

11. The semiconductor device according to claim 1, further comprising:

a damaged region in a portion of the interlayer insulation layer adjacent to the via plug and the first wiring line, wherein a carbon concentration in the damaged region is lower than a carbon concentration in the interlayer insulation layer.

12. The semiconductor device according to claim 1, wherein a width of an upper portion of the first via insulation liner is smaller than a width of a lower portion of the first via insulation liner.

13. The semiconductor device according to claim 1, further comprising a protection layer covering an upper surface of the first wiring line.

14. The semiconductor device according to claim 1, further comprising a lower conductive pattern in the interlayer insulation layer below the via plug, the lower conductive pattern contacting the via plug, wherein the first via air-gap region exposes a portion of an upper surface of the lower conductive pattern to the first air-gap region and/or to the first via insulation liner.

15. The semiconductor device according to claim 1, further comprising:

a second wiring line in the interlayer insulation layer, the second wiring line being spaced apart from the first wiring line;

a second wiring insulation liner covering a sidewall of the second wiring line; and a second wiring air-gap region between the second wiring insulation liner and the interlayer insulation layer, the second wiring air-gap region exposing the second wiring insulation liner to the interlayer insulation layer.

16. The semiconductor device according to claim 15, wherein the second air-gap region extends below the second wiring line to expose a lower surface of the second air-gap region to the interlayer insulation layer.

17. A semiconductor device comprising:

an interlayer insulation layer on a semiconductor substrate;

a via plug and a wiring line on the via plug, in the interlayer insulation layer, the via plug and the wiring line coupled with each other and forming a stepped structure;

a first insulation layer covering a sidewall of the via plug and a sidewall of the wiring line;

a second insulation layer covering a sidewall of a portion of the first insulation layer covering the sidewall of the via plug, the second insulation layer comprising a different material from the first insulation layer;

an air-gap region between the interlayer insulation layer and the wiring line, the air-gap region exposing the first insulation layer to the interlayer insulation layer; and a damaged region in a portion of the interlayer insulation layer adjacent to the air-gap region and the second insulation layer, wherein a first carbon concentration in the damaged region is lower than a second carbon concentration in the interlayer insulation layer and is higher than a third carbon concentration in the second insulation layer.

18. The semiconductor device according to claim 17, wherein a first oxygen concentration in the damaged region is higher than a second oxygen concentration in the interlayer insulation layer and is lower than a third oxygen concentration in the second insulation layer.

19. A semiconductor device comprising:
- an interlayer insulation layer on a semiconductor substrate;
- a via plug and a wiring line on the via plug, in the interlayer insulation layer, the via plug and the wiring line coupled with each other and forming a stepped structure;
- a first air-gap region between the interlayer insulation layer and the via plug; and
- a second air-gap region between the interlayer insulation layer and the wiring line;
- wherein the first air-gap region and the second air-gap region are not vertically overlapped with each other in a plan view of the semiconductor device.

20. The semiconductor device according to claim 19, further comprising:
- a connection air-gap region connecting between the first air-gap region and the second air-gap region, the connection air-gap region exposing a lower surface of the wiring line to the interlayer insulation layer,
- wherein a vertical width of the connection air-gap region is smaller than a horizontal width of the first air-gap region.

* * * * *